US012660100B2

(12) United States Patent (10) Patent No.: US 12,660,100 B2
Itoh et al. (45) Date of Patent: Jun. 16, 2026

(54) SEMICONDUCTOR MODULE, SEMICONDUCTOR DEVICE, AND VEHICLE

(71) Applicant: FUJI ELECTRIC CO., LTD., Kawasaki (JP)

(72) Inventors: Taichi Itoh, Kawasaki (JP); Yoshihiro Kodaira, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 112 days.

(21) Appl. No.: 18/820,477

(22) Filed: Aug. 30, 2024

(65) Prior Publication Data

US 2024/0431041 A1 Dec. 26, 2024

Related U.S. Application Data

(63) Continuation of application No. PCT/JP2023/028240, filed on Aug. 2, 2023.

(30) Foreign Application Priority Data

Sep. 16, 2022 (JP) ................................. 2022-148608

(51) Int. Cl.
*H05K 5/00* (2025.01)
(52) U.S. Cl.
CPC ........... *H05K 5/0073* (2013.01); *H05K 5/006* (2013.01); *H05K 5/0095* (2013.01)
(58) Field of Classification Search
None
See application file for complete search history.

(56) References Cited

U.S. PATENT DOCUMENTS

2009/0086431 A1* 4/2009 Sakamoto .......... H05K 7/20009
361/796
2011/0012251 A1 1/2011 Teramae
(Continued)

FOREIGN PATENT DOCUMENTS

JP S62-061349 A 3/1987
JP H07-335800 A 12/1995
(Continued)

OTHER PUBLICATIONS

International Search Report for PCT/JP2023/028240, mailed on Oct. 31, 2023.
Written Opinion for PCT/JP2023/028240, mailed on Oct. 31, 2023.

*Primary Examiner* — James Wu
*Assistant Examiner* — Christopher L Augustin
(74) *Attorney, Agent, or Firm* — Rabin & Berdo. P. C.

(57) ABSTRACT

A semiconductor module includes a circuit board mounted on a base, a case having a sidewall and a lid and covering the circuit board, a plurality of conductive plates each parallel to a predetermined plane, electrically connected to different conductive patterns. The lid of the case has a partition that protrudes from an inner surface of the lid toward the base between two of the conductive plates. The partition has a first portion at a position where the partition and the conductive plates overlap each other, and a second portion at a position where the partition and the conductive plates do not overlap each other in a side view. The second portion has a cutout section disposed such that in a depth direction, a distance from the base to the second portion is greater than a distance from the base to the first portion.

8 Claims, 13 Drawing Sheets

(56) References Cited

U.S. PATENT DOCUMENTS

| | | | | |
|---|---|---|---|---|
| 2014/0210067 A1* | 7/2014 | Takamiya | ......... | H01L 23/49811 |
| | | | | 257/698 |
| 2014/0346659 A1 | 11/2014 | Nakamura et al. | | |
| 2017/0301594 A1* | 10/2017 | Takamura | .............. | H01L 23/24 |
| 2021/0068299 A1* | 3/2021 | Haraguchi | ......... | H05K 7/14322 |
| 2022/0399241 A1* | 12/2022 | Itoh | ......................... | H01L 23/24 |

FOREIGN PATENT DOCUMENTS

| | | | |
|---|---|---|---|
| JP | 2001-345417 | A | 12/2001 |
| JP | 2006-121861 | A | 5/2006 |
| JP | 2011-023458 | A | 2/2011 |
| JP | 2015-041659 | A | 3/2015 |
| JP | 2017-195420 | A | 10/2017 |
| WO | 2013/145619 | A1 | 10/2013 |

* cited by examiner

SECOND SPACE          FIRST SPACE          THIRD SPACE 214    700    215

701

4

SECOND SPACE        FIRST SPACE        THIRD SPACE Z

Y ←⊗ X 214    702    215

701

4

200

SECOND SPACE        FIRST SPACE        THIRD SPACE

Z

Y ←⊗ X

SEMICONDUCTOR MODULE, SEMICONDUCTOR DEVICE, AND VEHICLE

This is a continuation application of International Application PCT/JP2023/028240 filed on Aug. 2, 2023 which claims priority from a Japanese Patent Application No. 2022-148608 filed on Sep. 16, 2022, the contents of which are incorporated herein by reference.

TECHNICAL FIELD

The present invention relates to a semiconductor module, a semiconductor device, and a vehicle.

BACKGROUND ART

A semiconductor module used in a power conversion device such as an inverter device includes a semiconductor element such as an insulated gate bipolar transistor (IGBT), a power metal oxide semiconductor field effect transistor (MOSFET), and a free wheeling diode (FWD).

In such type of semiconductor module, a circuit board in which a circuit component such as a semiconductor element is mounted on a wiring board is accommodated in a case, and then the case is filled with a sealing material to seal the circuit board.

In addition, in such type of semiconductor module, for example, various measures have been taken to prevent corrosion of circuit components such as semiconductor elements, wiring members, and the like in a circuit board due to corrosive gas, and decrease of insulation properties due to dust, moisture, and the like.

For example, Patent Literature 1 discloses a power conversion device including: a power circuit module in which a power circuit board mounted with a power semiconductor is sealed with insulating resin while a lead terminal is drawn to outside; and a control circuit module in which a control circuit substrate for driving and controlling the power semiconductor is sealed with insulating resin while a connection portion is exposed to outside, in which the lead terminal of the power circuit module is attached to, electrically connected to, and mechanically integrated with the connection portion of the control circuit module.

In addition, for example, Patent Literature 2 discloses a semiconductor device in which an upper surface side of a silicone gel for sealing a power device and a control circuit in a case is further filled with epoxy resin.

CITATION LIST

Patent Literature

Patent Literature 1: JP 2006-121861 A
Patent Literature 2: JP H07-335800 A

SUMMARY OF INVENTION

Technical Problem

Examples of the case of the semiconductor module described above include an example in which a side surface portion surrounding a circuit component such as a semiconductor element mounted on a circuit board and a lid portion serving as a lid above the circuit board are integrated, and an injection hole for injecting a sealing material is provided in the lid portion. When such a case is used, the circuit board is covered with the case, and then a sealing material is injected from the injection hole to seal the circuit component or the like of the circuit board.

In a semiconductor module using a case having a lid portion, a space for accommodating a circuit component is divided into two or more spaces by a protruding portion such as a partition or a beam provided on a surface on a side of the space for accommodating the circuit component in the case and the sealing material injected from the injection hole to ensure insulation between terminals. However, in such a semiconductor module, after the space for accommodating the circuit component is divided into two or more spaces by injecting the sealing material, it is difficult to inject, for example, an additional sealing material from the injection hole and evenly fill the divided spaces, the additional sealing material preventing corrosion by a corrosive gas.

In one aspect, an object of the present invention is to reduce filling unevenness of a sealing material in a semiconductor module using a case in which a lid portion is integrated.

Solution to Problem

According to one aspect, a semiconductor module includes: a base on which a circuit board is mounted; a case that covers the circuit board mounted on the base, the case having a side surface portion surrounding an outer periphery of the circuit board and a lid portion positioned above the circuit board; a plurality of conductor plates each of which is electrically connected to a conductor pattern of the circuit board and extends to an outside of the case through a slit provided in the case; and a sealing material that seals the circuit board, in which the case has a partition portion that is disposed in a region surrounded by the lid portion, the side surface portion, and the circuit board, is disposed between the plurality of conductor plates, and insulates the plurality of conductor plates, and the partition portion has a cutout section at a position not overlapping the plurality of conductor plates when viewed from a direction perpendicular to a plane on which the plurality of conductor plates and the partition portion extend in parallel to each other, and thus a height of a second portion not overlapping the plurality of conductor plates is lower than a height of a first portion overlapping the plurality of conductor plates.

Advantageous Effects of Invention

In the above aspect, it is possible to reduce filling unevenness of a sealing material in a semiconductor module using a case in which a lid portion is integrated.

DESCRIPTION OF EMBODIMENTS

Figure 1:
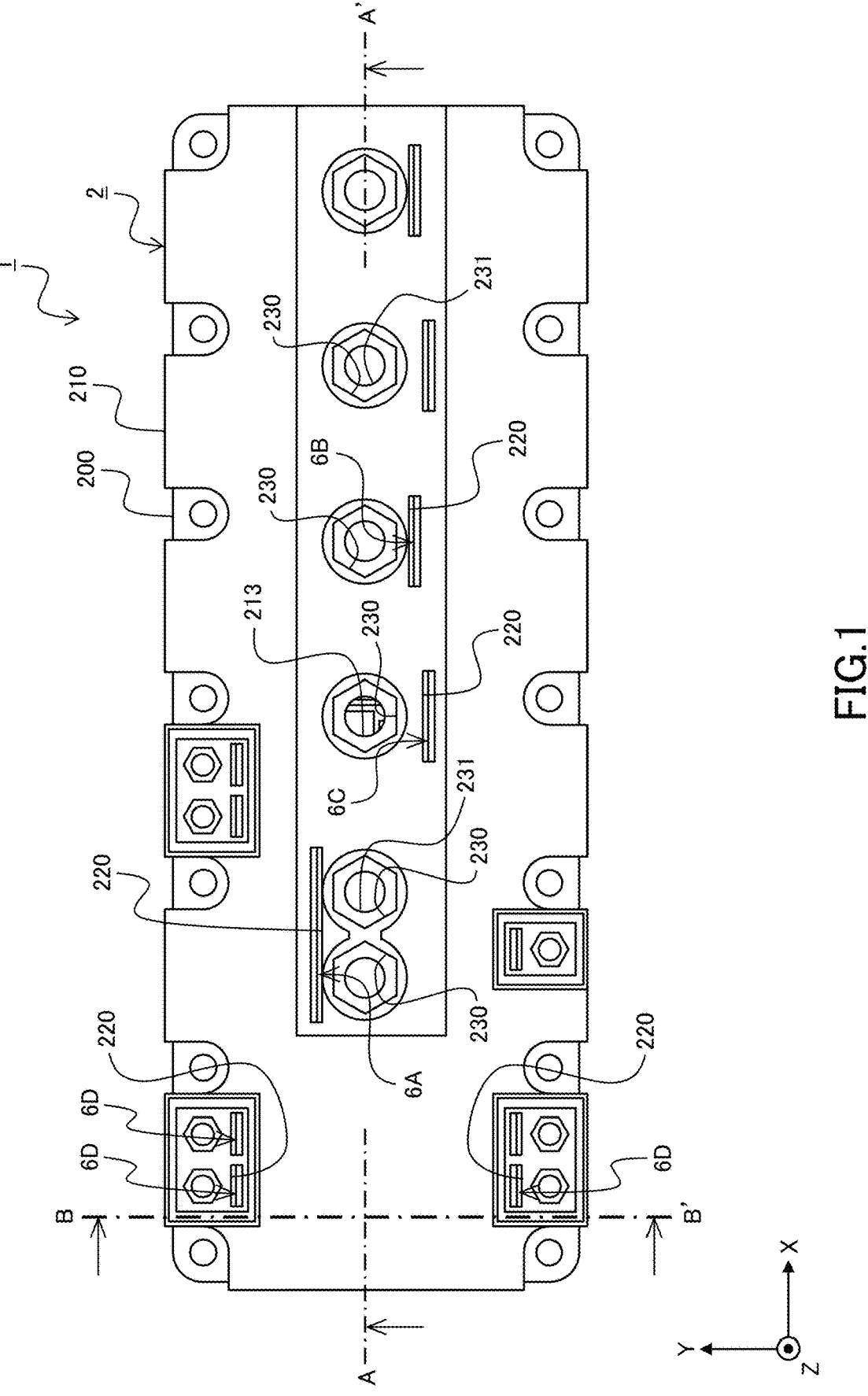
FIG. 1 is a plan view for describing a configuration example of a semiconductor device according to an embodiment.

Hereinafter, embodiments of a semiconductor module and a semiconductor device to which the present invention can be applied are described with reference to the drawings. The term "semiconductor module" in the present specification and claims refers to a device obtained by accommodating a circuit board in which a circuit component such as a semiconductor element is mounted on a wiring board in a case and then filling the case with a sealing material to seal the circuit board. The term "semiconductor device" in the present specification and claims refers to a device including at least one semiconductor module and a component different from the semiconductor module (for example, a cooler) in an integrated manner. Note that an X direction, a Y direction, and a Z direction illustrated in the drawings to be referred to correspond to a longitudinal direction, a lateral direction, and a height direction of the semiconductor module, respectively. The axes of the illustrated X, Y, and Z are perpendicular to each other and form a right-handed system. In the following description, the Z direction may be referred to as a vertical direction.

In the following description of the present specification, for example, an end surface of an illustrated component on a negative side in the Z direction is referred to as a lower surface, and an end surface on the opposite side thereof (that is, a positive side in the Z direction) is referred to as an upper surface. In the present specification, the term "in plan view" means a view where an upper surface or a lower surface of the semiconductor module is viewed in the Z direction.

The semiconductor module described in the following description is applied to, for example, a power conversion device such as an inverter device of an industrial or in-vehicle motor. The configuration of the semiconductor module illustrated in the drawings referred to in the following description is simplified to the extent that does not hinder the understanding of the present invention by those skilled in the art and does not necessarily coincide with the actual configuration of the semiconductor module. Furthermore, an aspect ratio and a size relationship between the members in each drawing are merely schematically represented and do not necessarily coincide with an actual relationship in the semiconductor module. For convenience of description, it is also assumed that the size relationship between the members is exaggerated. In the following description with reference to the drawings, detailed descriptions of a known configuration, function, operation, manufacturing method, and the like of the semiconductor module are omitted within a scope that does not hinder understanding of the present invention by those skilled in the art.

Figure 2:
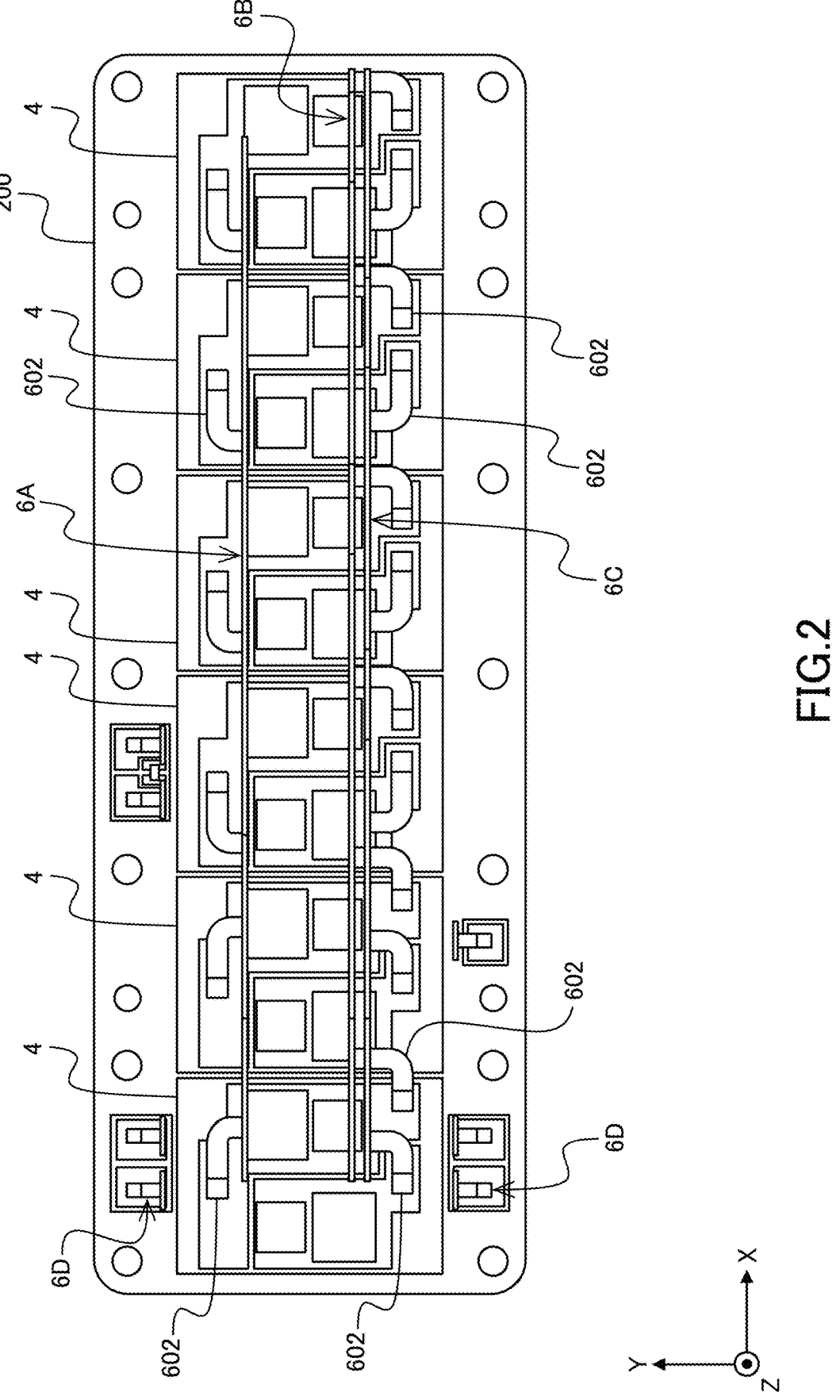
FIG. 2 is a plan view in which a case of the semiconductor device in FIG. 1 is omitted.
Figure 3:
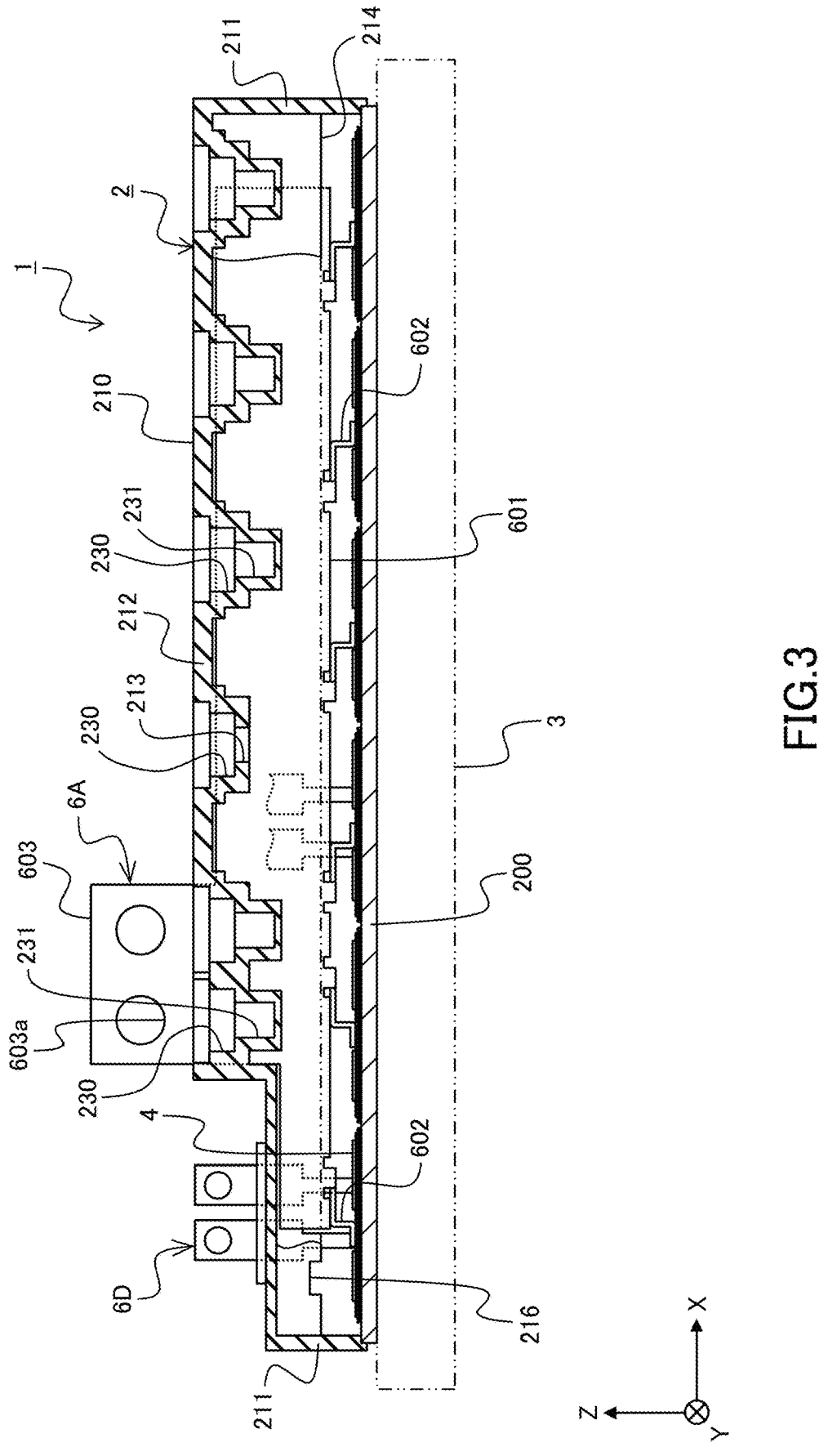
FIG. 3 is a side cross-sectional view for describing a configuration example of the semiconductor device when a positive side in a Y direction is viewed from a position of a line A-A' in FIG. 1.
Figures 4, 5:
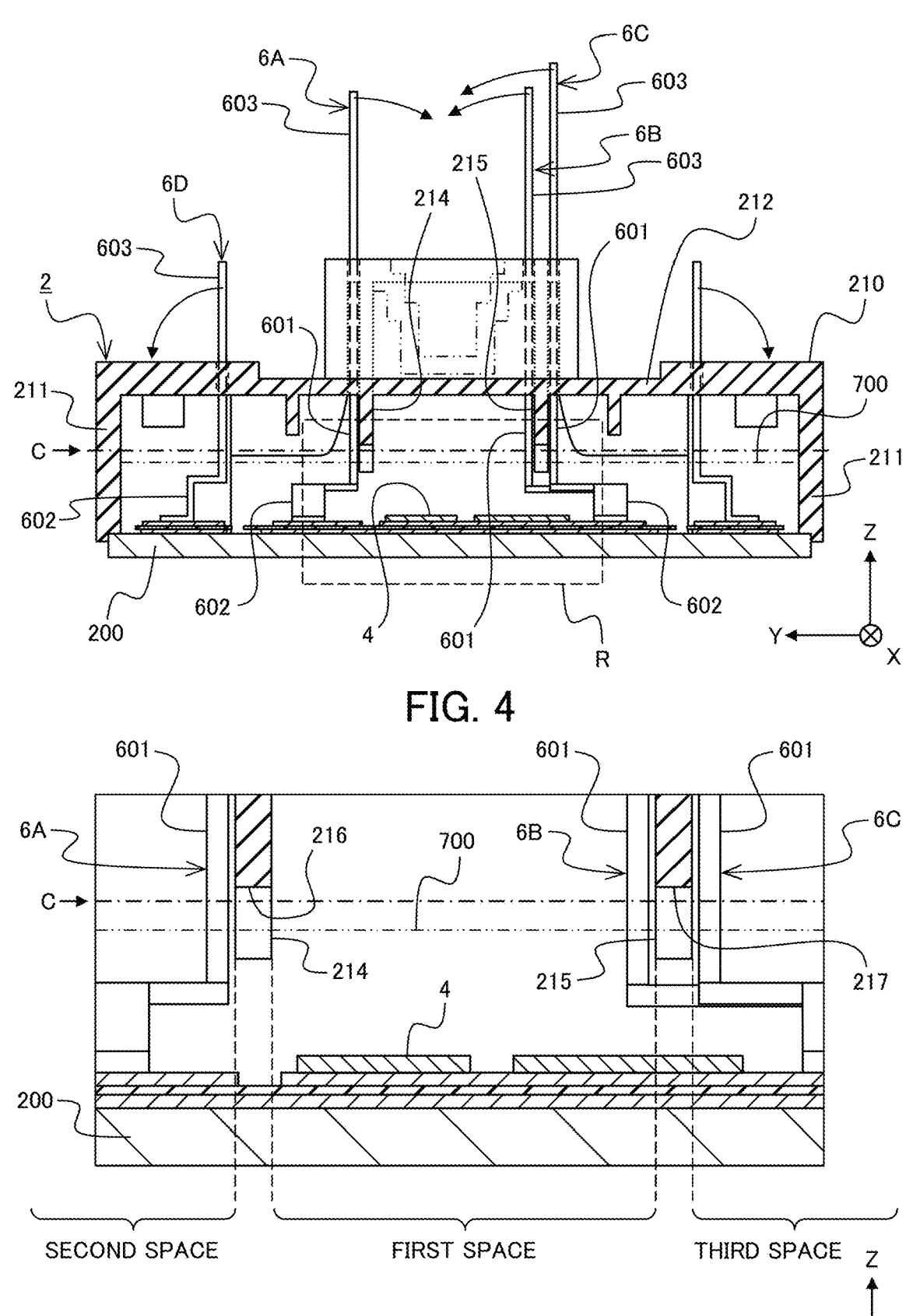
FIG. 4 is a side cross-sectional view for describing a configuration example of a semiconductor module when a positive side in an X direction is viewed from a position of a line B-B' in FIG. 1.
FIG. 5 is an enlarged view of a region R in FIG. 4.
Figure 6:
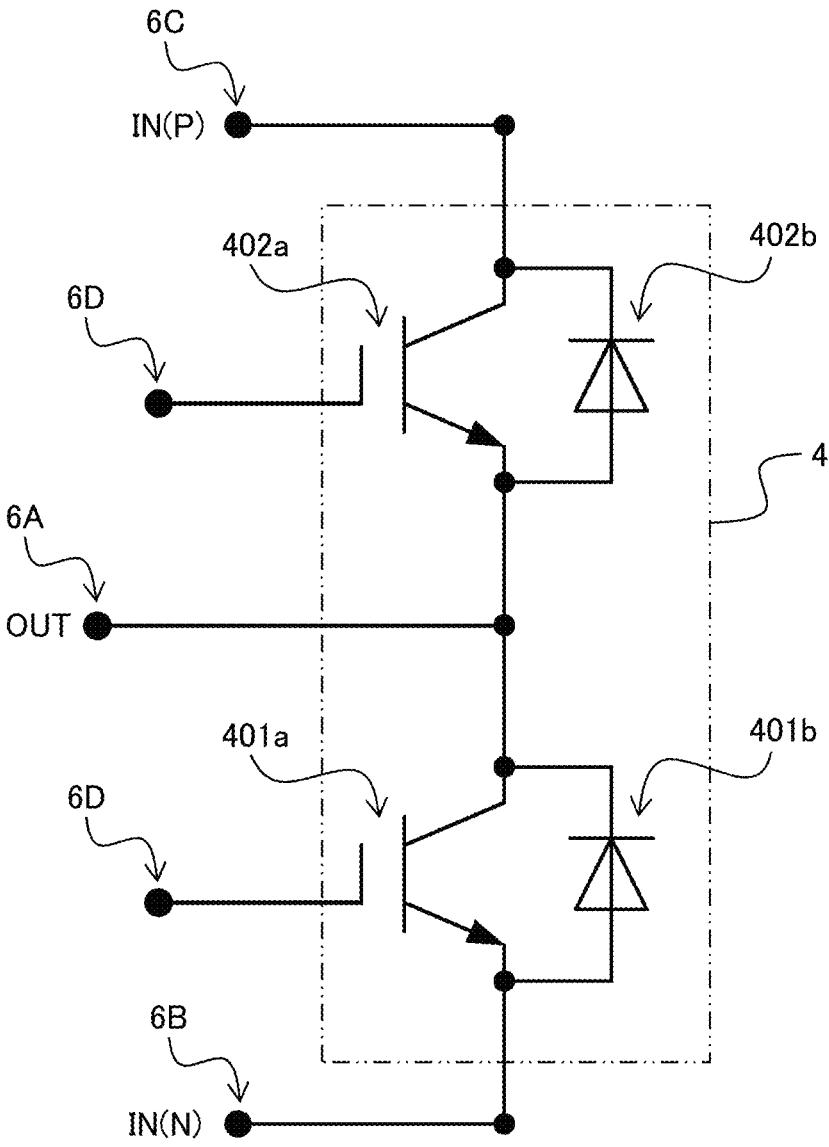
FIG. 6 is a side cross-sectional view for describing a configuration example of the periphery of a lid portion of the case in a finished product of the semiconductor device.
Figure 7:
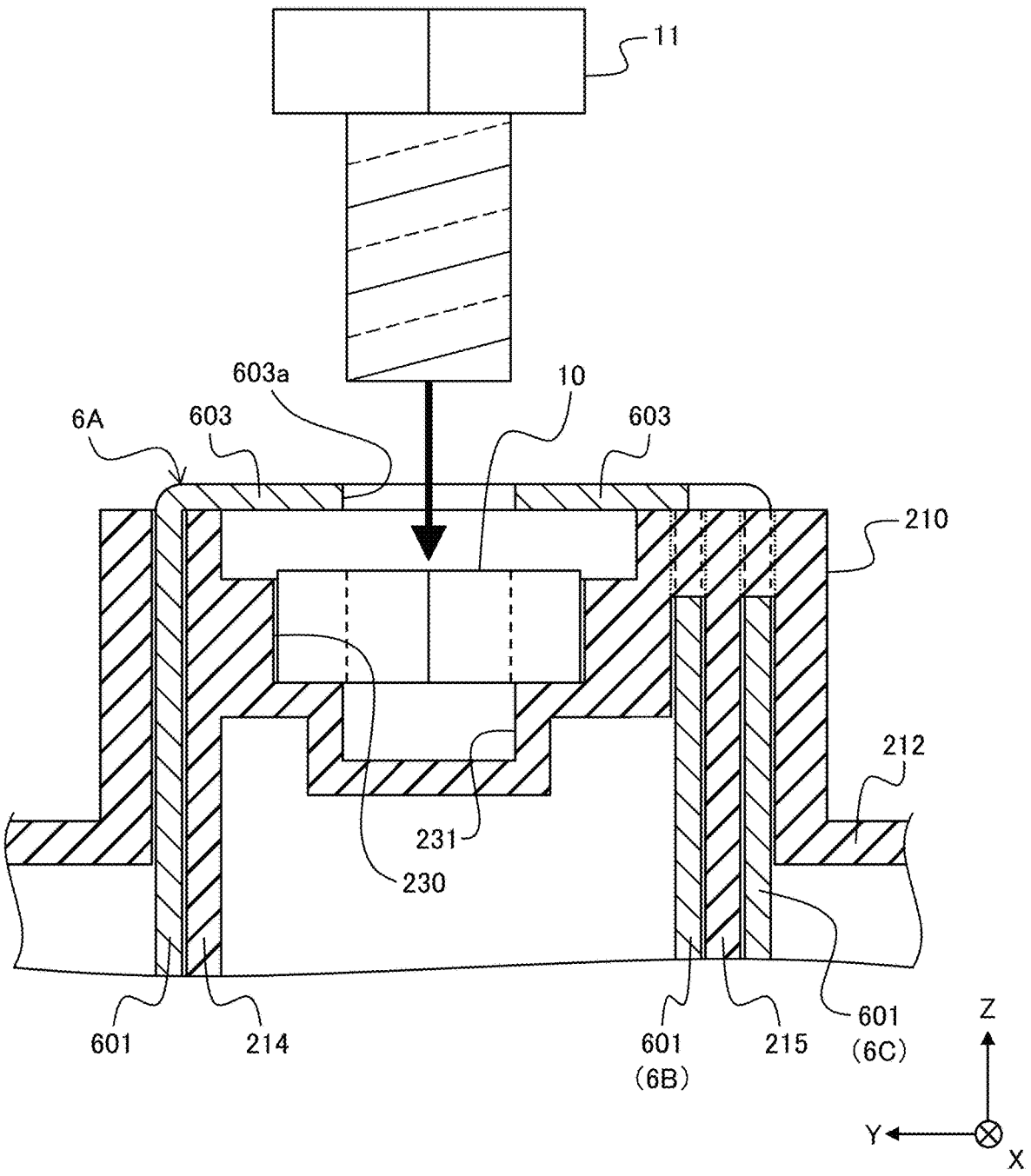
FIG. 7 is an equivalent circuit diagram for one phase in the semiconductor device of FIG. 1.

FIG. 1 is a plan view for describing a configuration example of a semiconductor device according to an embodiment. FIG. 2 is a plan view in which a case of the semiconductor device in FIG. 1 is omitted. FIG. 3 is a side cross-sectional view for describing a configuration example of the semiconductor device when a positive side in the Y direction is viewed from a position of a line A-A' in FIG. 1. FIG. 4 is a side cross-sectional view for describing a configuration example of the semiconductor module when a positive side in the X direction is viewed from a position of a line B-B' in FIG. 1. FIG. 5 is an enlarged view of a region R in FIG. 4. FIG. 6 is a side cross-sectional view for describing a configuration example of the periphery of a lid portion of the case in a finished product of the semiconductor device. FIG. 7 is an equivalent circuit diagram for one phase of a circuit board in the semiconductor device of FIG. 1. Note that FIGS. 1 to 5 illustrate a state in the middle of manufacturing the semiconductor module in the semiconductor device according to the present embodiment, more specifically, a state after the case is attached to the base on which the circuit board is mounted and before the sealing material is injected into the case.

A semiconductor device 1 illustrated in FIGS. 1 to 5 includes a semiconductor module 2 and a cooler 3 disposed on a lower surface of the semiconductor module 2. The cooler 3 releases heat of the semiconductor module 2 to outside and has a rectangular parallelepiped shape as a whole. Although not particularly illustrated, the cooler 3 is configured by providing a plurality of fins on a lower surface side of a base portion and accommodating the fins in a water jacket. Note that the configuration of the cooler 3 is not limited thereto and can be appropriately changed.

The semiconductor module 2 includes a base 200 on which a circuit board 4 and the like are mounted, a case 210 that covers the circuit board 4 and the like mounted on the base 200, conductor plates 6A to 6D that are electrically connected to a conductor pattern of the circuit board 4 mounted on the base 200 and extend to the outside of the semiconductor module 2 through slits 220 provided in the case 210, and a sealing material (not illustrated).

The base 200 is a plate-shaped member on which the circuit board 4 obtained by mounting a circuit component such as a semiconductor element on the wiring board, a wiring board connected to the circuit board 4, and the like are mounted, and that conducts heat generated in the circuit board 4 and the like to the cooler 3. The wiring board in the circuit board 4 is configured, for example, with a direct copper bonding (DCB) substrate, an active metal brazing (AMB) substrate, or a metal base substrate. The semiconductor element mounted on the wiring board may be, for example, a combination of one or more switching elements including an insulated gate bipolar transistor (IGBT), a power metal oxide semiconductor field effect transistor (MOSFET), and the like and one or more diode elements including a free wheeling diode (FWD) and the like, or one of the switching elements or diode elements. The semiconductor element may be a reverse conducting (RC)-IGBT element in which functions of an IGBT element and an FWD element are integrated. The semiconductor element may be, for example, a reverse blocking (RB)-IGBT or the like having a sufficient withstand voltage against a reverse bias. The semiconductor element mounted on the wiring board may include an element different from the switching element and the diode element.

Although six circuit boards 4 are illustrated in FIG. 2, the number of circuit boards 4 to be mounted is not limited thereto. In addition, the conductor pattern of the wiring board in the circuit board 4, the mounting position of the semiconductor elements, the number of semiconductor elements to be mounted, and the like are not limited to those illustrated in the drawings.

The conductor plates 6A to 6D are used as external terminals of the semiconductor module 2 and are formed of metal plates such as copper plates. The conductor plates 6A to 6D may be referred to as a lead, a lead frame, a bus bar, or the like.

The first conductor plate 6A, the second conductor plate 6B, and the third conductor plate 6C are used as, for example, an output terminal OUT, an N terminal (input terminal) IN(N), and a P terminal (input terminal) IN(P) in the circuit of the circuit board 4 illustrated in FIG. 6. A switching element 401*a* and a diode element 401*b* connected between the first conductor plate 6A and the second conductor plate 6B, and a switching element 402*a* and a diode element 402*b* connected between the first conductor plate 6A and the third conductor plate 6C may be separate semiconductor elements or may be included in one semiconductor element. Gates of the switching elements 401*a* and 402*a* are connected to the fourth conductor plate 6D via a control circuit (not illustrated).

Each of the first conductor plate 6A, the second conductor plate 6B, and the third conductor plate 6C includes a plate-shaped base portion 601, and a first terminal portion 602 and a second terminal portion 603 protruding from the base portion 601. The first terminal portion 602 of the first conductor plate 6A is electrically connected to a conductor pattern that is an output terminal of the circuit described above with reference to FIG. 6 among conductor patterns of the circuit board 4 (wiring board). The first terminal portion 602 of the second conductor plate 6B is electrically connected to a collector of the switching element via the conductor pattern of the circuit board 4. The third conductor plate 6C is electrically connected to an emitter of the switching element via the conductor pattern of the circuit board 4. The first terminal portions 602 of the first conductor plate 6A, the second conductor plate 6B, and the third conductor plate 6C are subjected to bending processing such that the main planes of the base portions 601 of the conductor plates 6A to 6C are parallel to a ZX plane when the first terminal portions 602 are connected (bonded) to the conductor pattern of the circuit board 4.

Each of the second terminal portions 603 of the first conductor plate 6A, the second conductor plate 6B, and the third conductor plate 6C extends to the outside of the semiconductor module 2 via the slit 220 of the case 210. Each of the second terminal portions 603 of the first conductor plate 6A, the second conductor plate 6B, and the third conductor plate 6C in the middle of the manufacturing illustrated in FIGS. 2 to 4 extends in a direction extending the main plane of the base portion 601 (positive side in the Z direction). However, in the finished product of the semiconductor device 1, for example, as illustrated in FIG. 7, portions of the second terminal portions 603 extending to the outside of the semiconductor module 2 are bent along the upper surface of the case 210. A nut fitting portion 230 into which a nut 10 is fitted is provided in portions of the upper surface of the case 210 overlapping the bent second terminal portions 603. A lower end (bottom surface) of the nut fitting portion 230 is provided with a recess portion 231 that receives a shaft of a bolt 11 used in combination with the nut 10. In the case 210 illustrated in FIGS. 1 and 3, a total of six nut fitting portions 230 are formed; two in a region overlapping one second terminal portion 603 of the first conductor plate 6A, one in each region overlapping two second terminal portions 603 of the second conductor plate 6B, and one in each region overlapping two second terminal portions 603 of the third conductor plate 6C. The second terminal portions 603 of the first conductor plate 6A, the second conductor plate 6B, and the third conductor plate 6C are formed with an opening 603*a* that overlaps a hole of the nut 10 when the terminal portions 603 are bent. In the semiconductor device 1, by screwing and fastening the shaft of the bolt 11 into the hole of the nut 10, the terminal of the wiring can be connected to each of the second terminal portions 603 of the conductor plates 6A, 6B, and 6C. Note that in the case 210 of the semiconductor device 1 exemplified in the present embodiment, an injection hole 213 for injecting a sealing material into the case 210 is provided on the bottom surface of one nut fitting portion 230 among the six nut fitting portions 230.

Each of the plurality of fourth conductor plates 6D includes, for example, the first terminal portion 602 connected to the control circuit and the second terminal portion 603 extending to the outside of the semiconductor module 2 via the slit 220 of the case 210. The second terminal portion 603 of the fourth conductor plate 6D in the middle of the manufacturing illustrated in FIGS. 2 to 4 extends in a direction extending the main plane of the base portion 601 (positive side in the Z direction). However, in the finished product of the semiconductor device 1, similarly to the second terminal portions 603 of the other conductor plates 6A, 6B, and 6C described above with reference to FIG. 7, the second terminal portion 603 of the fourth conductor plate 6D is also bent such that the portion of each second terminal portion 603 extending to the outside of the semiconductor module 2 is along the upper surface of the case 210. In addition, a nut fitting portion (not illustrated) similar to the nut fitting portion 230 described above with reference to FIG. 7 is provided in a region overlapping the bent second terminal portion 603 of the fourth conductor plate 6D on the upper surface of the case 210.

In the case 210, a side surface portion 211 surrounding the outer periphery of the circuit board 4 in plan view for filling the sealing material and a portion serving as a lid above the circuit board 4 (lid portion 212) are integrated, and the injection hole 213 for injecting the sealing material is provided in the lid portion 212. As described above, the injection hole 213 is formed, for example, on the bottom surface of the nut fitting portion 230 in the region overlapping one bent second terminal portion 603 in the third conductor plate 6C.

On a surface of the lid portion 212 of the case 210 on a side of a space in which the circuit board 4 and the like are accommodated (hereinafter referred to as an "inner surface"), there are provided a first partition portion 214 that insulates between the conductor plates between the base portion 601 of the first conductor plate 6A and the base portion 601 of the second conductor plate 6B, and a second partition portion 215 that insulates between the conductor plates between the second conductor plate 6B and the third conductor plate 6C. The first partition portion 214 extends along a main plane facing the base portion 601 side of the second conductor plate 6B among main planes of the base portion 601 of the first conductor plate 6A. The second partition portion 215 extends along a main plane facing the base portion 601 side of the third conductor plate 6C among main planes of the base portion 601 of the second conductor plate 6B. The main planes of the base portions 601 of the conductor plates 6A, 6B, and 6C are planes on which the plurality of conductor plates 6A, 6B, and 6C and the partition portions 214 and 215 extend in parallel to each other.

The first partition portion 214 and the second partition portion 215 have functions as ribs for increasing the strength of the case 210 and preventing deformation of the case 210 due to warping or twisting. As exemplified in FIG. 3, for example, an end portion of the first partition portion 214 in the X direction is connected to an inner surface of the side surface portion 211 of the case 210. Although not illustrated, the end portion of the second partition portion 215 in the X direction is also connected to the inner surface of the side surface portion 211 of the case 210.

The dimension (height) of the first partition portion 214 and the second partition portion 215 from the inner side surface to the lower end (end on the negative side in the Z direction) is set such that, for example, a space that comes into contact with the sealing material injected from the injection hole 213 and accommodates the circuit board 4 and the like in the case 210 (hereinafter referred to as an "accommodation space") is separated into three spaces. That is, as illustrated in FIGS. 4 and 5, an upper surface 700 of the sealing material injected from the injection hole 213 is above the lower ends of the first partition portion 214 and the second partition portion 215. In the following description, a space between the first partition portion 214 and the second partition portion 215 is referred to as a first space, a space separated from the first space by the first partition portion 214 is referred to as a second space, and a space separated from the first space by the second partition portion 215 is referred to as a third space. In the semiconductor module 2 illustrated in FIGS. 1 to 5, the injection hole 213 and the slit 220 through which the second terminal portion 603 of the second conductor plate 6B passes are provided in a portion defining the first space in the lid portion 212. The slit 220 through which the second terminal portion 603 of the first conductor plate 6A passes and the slit 220 through which the second terminal portion 603 of the fourth conductor plate 6D passes are provided in a portion defining the second space of the lid portion 212. The slit 220 through which the second terminal portion 603 of the third conductor plate 6C passes and the slit 220 through which the second terminal portion 603 of the fourth conductor plate 6D passes are provided in a portion defining the third space of the lid portion 212.

In the case 210 in the semiconductor module 2 according to the present embodiment, as illustrated in FIGS. 3 to 5, a cutout section 216 in which the position of the lower end is displaced toward the inner surface side is provided in a portion of the first partition portion 214 outside a portion along the base portion 601 of the first conductor plate 6A (a portion overlapping the base portion 601). Similarly, a cutout section 217 in which the position of the lower end is displaced to the inner side surface side is provided in a portion of the second partition portion 215 outside a portion along the base portion 601 of the second conductor plate 6B (a portion overlapping the base portion 601). In other words, the partition portions 214 and 215 have the cutout sections 216 and 217 at positions not overlapping the plurality of conductor plates when viewed from a direction (Y direction in the drawing) perpendicular to a plane (ZX plane in the drawing) on which the plurality of conductor plates 6A, 6B, and 6C and the partition portions 214 and 215 extend in parallel to each other, so that a height of a portion (second portion) where the plurality of conductor plates do not overlap is lower than a height of a portion (first portion) overlapping the plurality of conductor plates 6A, 6B, and 6C. In still other words, since the partition portions 214 and 215 have the cutout sections 216 and 217, the distance from the lower end of the second portion where the plurality of conductor plates do not overlap to the base 200 in the partition portions 214 and 215 is longer than the distance from the lower end of the first portion where the plurality of conductor plates overlap to the base 200.

When the sealing material is injected from the injection hole 213 to seal the circuit board 4 and the like in the manufacturing process of the semiconductor module 2 of the present embodiment, the first space and the second space communicate with each other by a through hole formed by the upper surface 700 of the sealing material and the cutout section 216 of the first partition portion 214. Similarly, the first space and the third space communicate with each other by a through hole formed by the upper surface 700 of the sealing material and the cutout section 217 of the second partition portion 215. Such a through hole communicating the two spaces is generated in a portion outside a portion overlapping with the base portion 601 of the conductor plate, and thus there is no influence on insulation between the conductor plates.

The case 210 described above is formed by injection molding using an insulating material having high heat resistance, high dimensional stability, and low hygroscopic property, such as poly phenylene sulfide (PPS) or poly amide (PA). In the case 210 formed by injection molding, the side surface portion 211, the lid portion 212, the first partition portion 214, and the second partition portion 215 are integrally formed. In the case 210, in the step of sealing the circuit board 4 and the like with the sealing material, the side surface portion 211 and the lid portion 212 having the injection hole 213 may be integrated, and the first partition portion 214 having the cutout section 216 and the second partition portion 215 having the cutout section 217 may be provided. Therefore, the method of forming the case 210 is not limited to a specific forming method.

Figure 8:
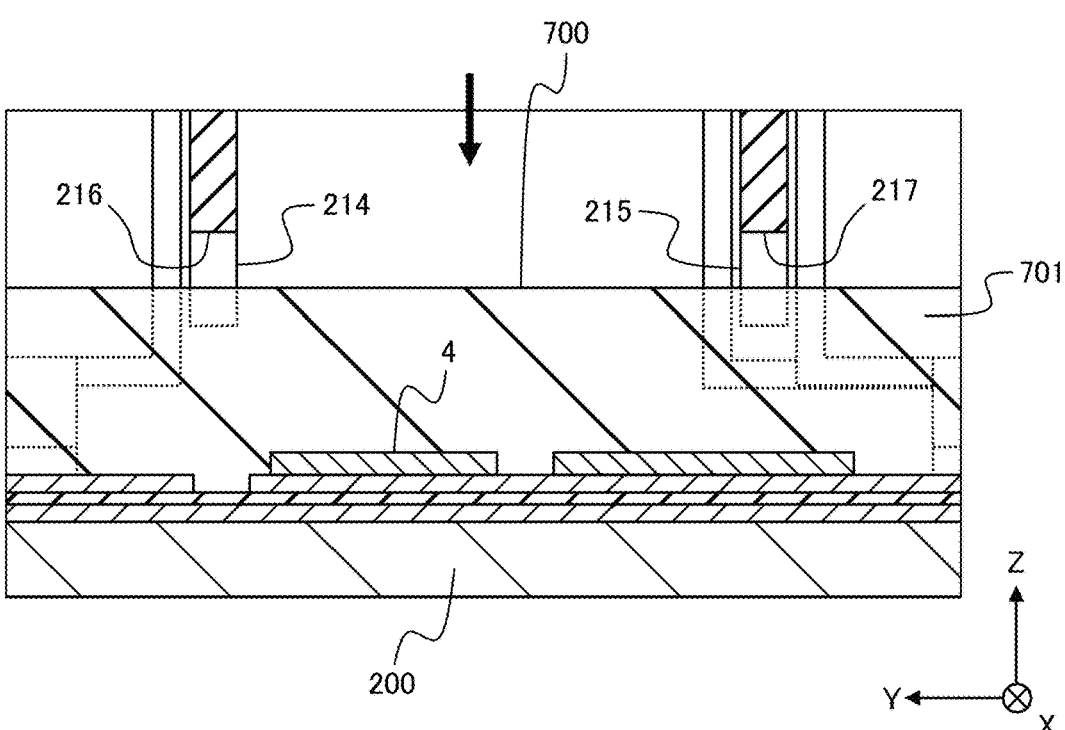
FIG. 8 is a side cross-sectional view in a step of injecting a first sealing material in a manufacturing process of the semiconductor module according to the present embodiment.
Figure 9:
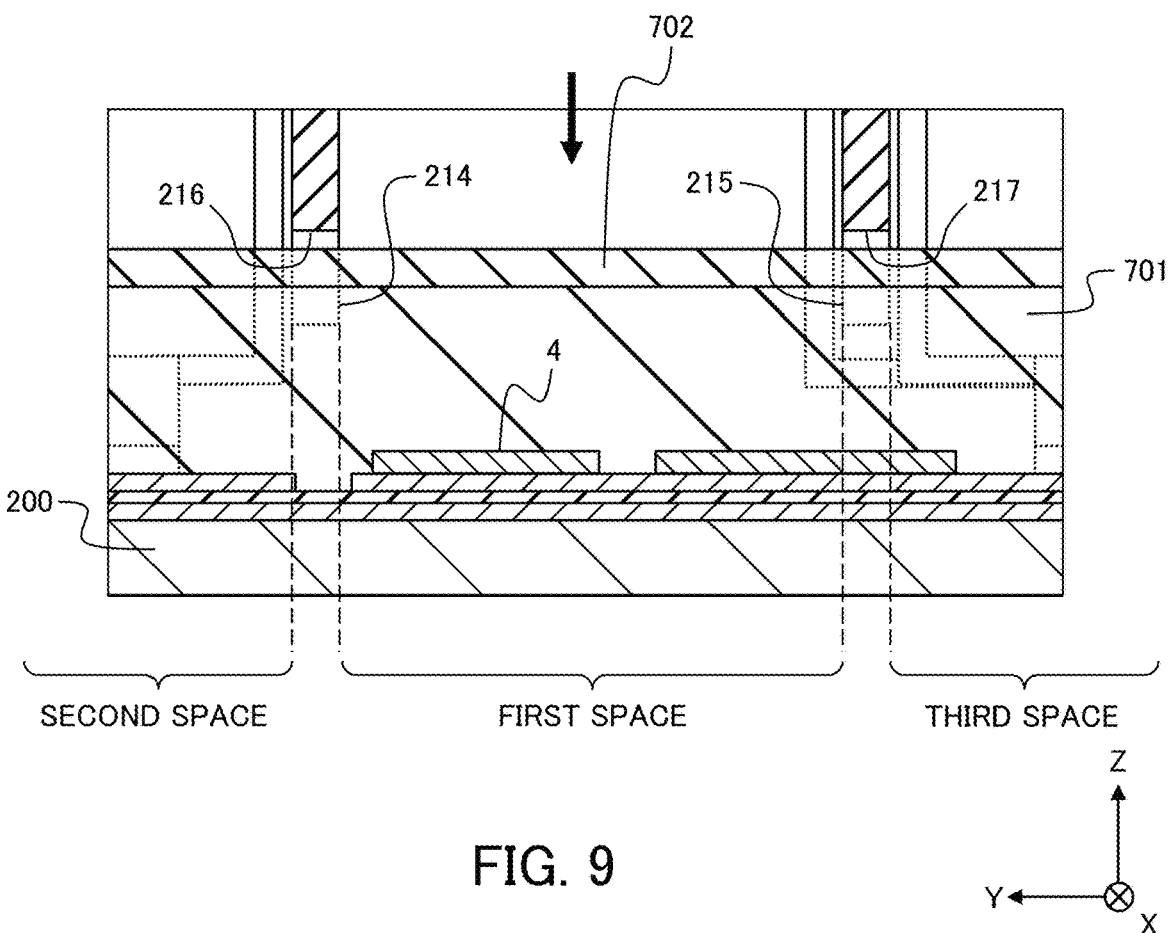
FIG. 9 is a side cross-sectional view in a step of injecting a second sealing material in the manufacturing process of the semiconductor module according to the present embodiment.
Figure 10:
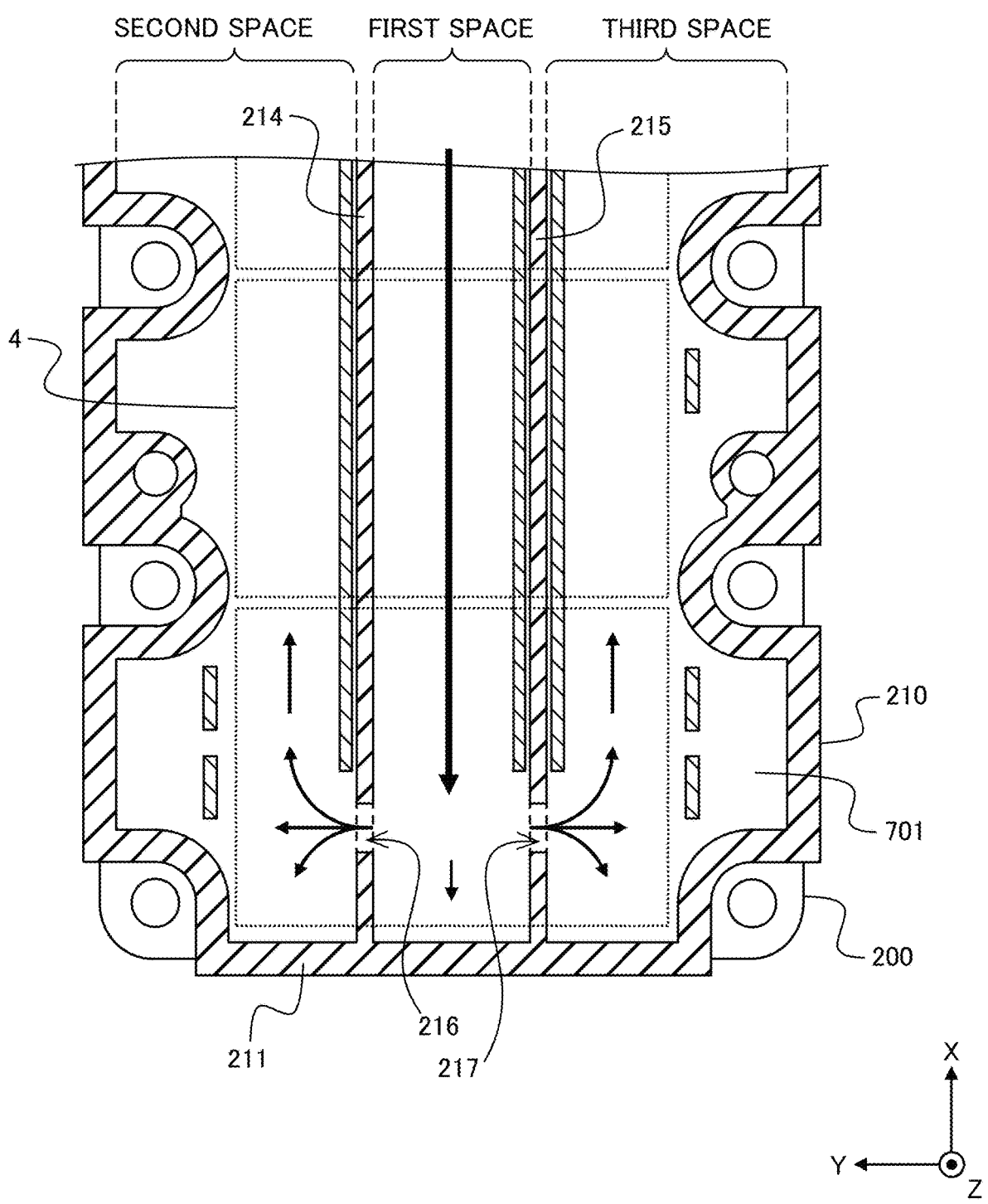
FIG. 10 is a view schematically illustrating a state of flow of the second sealing material in the step of injecting the second sealing material.

FIG. 8 is a side cross-sectional view in a step of injecting the first sealing material in the manufacturing process of the semiconductor module according to the present embodiment. FIG. 9 is a side cross-sectional view in a step of injecting the second sealing material in the manufacturing process of the semiconductor module according to the present embodiment. FIG. 10 is a view schematically illustrating a state of flow of the second sealing material in the step of injecting the second sealing material. Each of the ranges illustrated in FIGS. 8 and 9 corresponds to the region R in FIG. 4. FIG. 10 corresponds to a view seen downward (negative side in the Z direction) from a position C in FIG. 5.

In the manufacturing step (assembling step) of the semiconductor module 2 of the present embodiment, first, the circuit board 4, other wiring boards, and the like are mounted on the base 200, and further, the conductor plates 6A to 6D and the like are connected to a conductor pattern of the circuit board 4 and the like. Thereafter, the case 210 having the lid portion 212 is attached to the base 200 to cover the circuit board 4 and the like. For example, the base 200 and the case 210 are attached by tightening a screw (screwing) into a screw hole of the case 210 overlapping a round hole provided in the base 200. Here, the inside of the accommodation space of the case 210 is still one space as illustrated in FIG. 5.

Next, for example, as illustrated in FIG. 8, a first sealing step of injecting a first sealing material 701 from the injection hole 213 provided in the lid portion 212 of the case 210 to seal the circuit board 4 and the like is performed. As the first sealing material 701, for example, a silicone gel can be used. Materials used in the step of injecting a silicone gel as the first sealing material 701 to seal the circuit board 4 and the like, treatment at the time of injection and after injection, and the like are well known, and thus detailed description thereof is omitted in the present specification. The injection amount of the first sealing material 701 is adjusted to, for example, an amount such that the upper surface 700 after completion of the first sealing step is above the lower ends of the first partition portion 214 and the second partition portion 215 and below the lower ends of the cutout sections 216 and 217. After completion of the first sealing step, the accommodation space of the case 210 is divided into a first space, a second space communicating with the first space by a through hole formed at the position of the cutout section 216, and a third space communicating with the first space by a through hole formed at the position of the cutout section 217.

Next, for example, as illustrated in FIG. 9, a second sealing step of injecting a second sealing material 702 (additional sealing material) from the injection hole 213 provided in the lid portion 212 of the case 210 is performed. As the second sealing material 702, for example, an insulating material (for example, epoxy resin) that prevents corrosive gas such as hydrogen sulfide or moisture from passing through the first sealing material 701 (for example, silicone gel) and corroding circuit components and the like of the circuit board 4 can be used. The first sealing material 701 and the second sealing material 702 are not limited to a specific combination. For example, the first sealing material 701 and the second sealing material 702 may be a combination of insulating materials having the same function or a combination of insulating materials having the same composition.

In the second sealing step, lower ends of a portion of the first partition portion 214 along the base portion 601 of the first conductor plate 6A and a portion of the second partition portion 215 along the base portion 601 of the second conductor plate 6B are buried in the first sealing material 701. Therefore, as illustrated in FIG. 10, the second sealing material 702 injected from the injection hole 213 between the first partition portion 214 and the second partition portion 215 flows to the positive side and the negative side in the X direction along the upper surface of the first sealing material 701 in the first space between the first partition portion 214 and the second partition portion 215. Then, when the second sealing material 702 flowing in the first space reaches the end portion in the X direction where the cutout section 216 of the first partition portion 214 and the cutout section 217 of the second partition portion 215 are provided, a part of the second sealing material 702 flows from the first space into the second space through the through hole formed by the cutout section 216 of the first partition portion 214 and the first sealing material 701 and flows in the second space. Another portion of the second sealing material 702 flows from the first space into the third space through a through hole formed by the cutout section 217 of the second partition portion 215 and the first sealing material 701 and flows in the third space. Therefore, as illustrated in FIG. 9, the second sealing material 702 is filled on the first sealing material 701 in each of the first space, the second space, and the third space. Therefore, for example, corrosive gas, dust, moisture, and the like that enter the second space or the third space through the gap between the slit 220 of the case 210 and the second terminal portion 603 of the fourth conductor plate 6D can be prevented from passing through the first sealing material 701 by the second sealing material 702.

The first sealing step and the second sealing step described above are performed, for example, before the step of bending the second terminal portions 603 of the conductor plates 6A to 6D extending to the outside of the semiconductor module 2 through the slits 220 of the case 210 along the upper surface of the case 210. After the first sealing step and the second sealing step, as described above with reference to FIG. 7, the nuts 10 are fitted into the nut fitting portions 230 provided on the upper surface of the case 210, and the second terminal portions 603 of the conductor plates 6A to 6D are bent, whereby the semiconductor device 1 (semiconductor module 2) described in the present embodiment is completed. The injection hole 213 of the case 210 used for injecting the sealing material may be left as a hole (opened state) after the first sealing step and the second sealing step or may be closed by performing a predetermined treatment. In addition, the manufacturing procedure of the semiconductor device 1 (semiconductor module 2) of the present embodiment including the step of injecting the sealing material is not limited to the procedure described above. For example, the step of injecting the sealing material is not limited to the two steps described above and may be three or more steps.

Figures 11, 12:
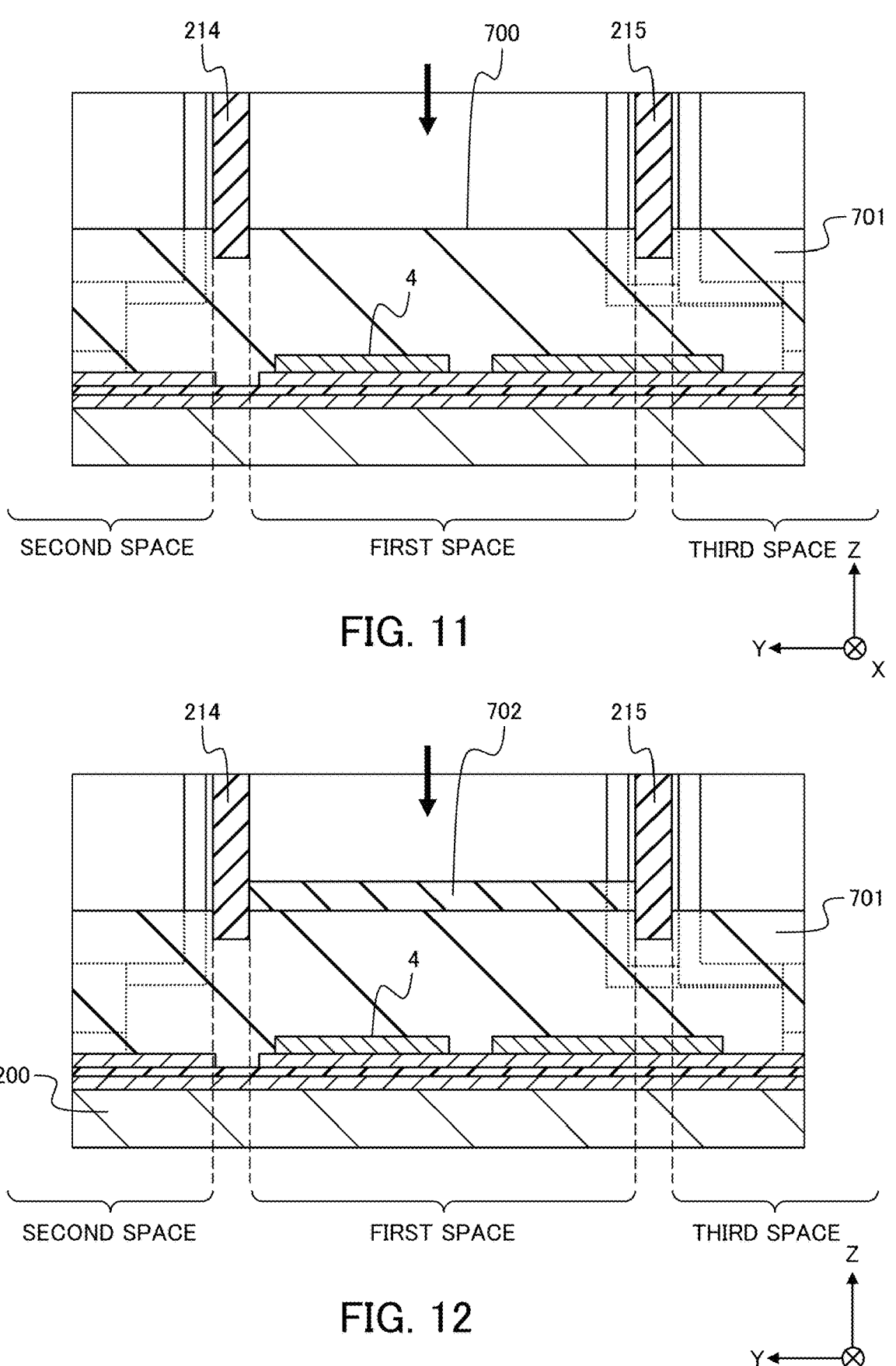
FIG. 11 is a side cross-sectional view in the step of injecting the first sealing material in a manufacturing process of a semiconductor module without a cutout section in a partition portion.
FIG. 12 is a side cross-sectional view in the step of injecting the second sealing material in the manufacturing process of the semiconductor module without the cutout section in the partition portion.

FIG. 11 is a side cross-sectional view in a step of injecting the first sealing material in a manufacturing process of a semiconductor module without the cutout section in the partition portion. FIG. 12 is a side cross-sectional view in a step of injecting the second sealing material in the manufacturing process of the semiconductor module without the cutout section in the partition portion. Each of the ranges illustrated in FIGS. 11 and 12 corresponds to the region R in FIG. 4.

When manufacturing (assembling) a semiconductor module using the case 210 in which the cutout section 216 of the first partition portion 214 and the cutout section 217 of the second partition portion 215 are not provided, after the first sealing step is completed, the accommodation space of the case 210 is divided into the first space, the second space, and the third space as illustrated in FIG. 11. Here, the through hole communicating the first space and the second space and the through hole communicating the first space and the third space are not formed. Therefore, when the second sealing step of injecting the second sealing material 702 (additional sealing material) from the injection hole 213 of the case 210 into the first space is continuously performed, the second sealing material 702 flowing along the upper surface of the first sealing material 701 in the first space cannot be supplied into the second space and the third space as illustrated in FIG. 12. Therefore, after completion of the second sealing step, the upper surfaces of the first sealing materials 701 in the second space and the third space are exposed.

When the second sealing material 702 is not filled on the first sealing material 701, corrosive gas, dust, moisture, and the like that enter the second space or the third space through the gap between the slit 220 of the case 210 and the second terminal portion 603 of the fourth conductor plate 6D may pass through the first sealing material 701 such that the circuit components and the like of the circuit board 4 is corroded and the insulation properties decreases.

On the other hand, in the manufacturing step of the semiconductor module 2 of the present embodiment, at least at the start of the second sealing step, the first space communicates with each of the second space and the third space while insulation between the conductor plates is ensured by the first partition portion 214, the second partition portion 215, and the first sealing material 710. Therefore, as described above with reference to FIGS. 9 and 10, the second sealing material 702 injected into the first space flows into and spreads in the second space and the third space, and the second sealing material 702 can be filled on the first sealing material 701 in the second space and the third space. Therefore, corrosive gas, dust, moisture, and the like that enter the second space or the third space through the gap between the slit 220 of the case 210 and the second terminal portion 603 of the fourth conductor plate 6D can be prevented from passing through the first sealing material 701 by the second sealing material 702.

The cutout section 216 of the first partition portion 214 and the cutout section 217 of the second partition portion 215 for communicating the first space with each of the second space and the third space at the start of the second sealing step are provided at a position outside a portion of the first partition portion 214 along the base portion 601 of the first conductor plate 6A and a position outside a portion of the second partition portion 215 along the base portion 601 of the second conductor plate 6B, respectively. Therefore, in the semiconductor module 2 of the present embodiment, the lower end portions of the portions of the first partition portion 214 and the second partition portion 215 of the case 210 along the conductor plate are in contact with the first sealing material 701 and are buried. Therefore, even if the first space and the second space communicate with each other at the position of the cutout section 216, and the first space and the third space communicate with each other at the position of the cutout section 217 after the second sealing material 702 is injected, the insulation between the conductor plates is ensured. Further, the end portions of the first partition portion 214 and the second partition portion 215 protruding from the inner side surface of the lid portion 212 of the case 210 in the X direction are connected to the inner side surface of the side surface portion 211 of the case 210, and thus the strength of the case 210 is increased and the function as a rib for preventing deformation of the case 210 due to warping or twisting is not impaired.

As a measure against the problem of the example in the related art described above with reference to FIGS. 11 and 12, particularly, it is conceivable to provide a plurality of injection holes for the sealing material in the second sealing step, but then, for example, the following problem occurs. That is, a problem occurs that a case shape becomes complicated because an injection hole corresponding to each space is required. A problem occurs that a takt time becomes long when the sealing material is filled from each of the plurality of injection holes. A problem occurs that the height becomes uneven when the sealing material is filled from each of the plurality of injection holes. Such problems can be avoided in the present invention.

The shapes of the cutout section 216 of the first partition portion 214 and the cutout section 217 of the second partition portion 215 in the case of the semiconductor module 2 of the present embodiment are not limited to the shapes illustrated in FIGS. 3 to 5. Hereinafter, some modifications of the shapes of the cutout sections 216 and 217 and other modifications are described with reference to FIGS. 13 to 16.

Figures 13, 14:
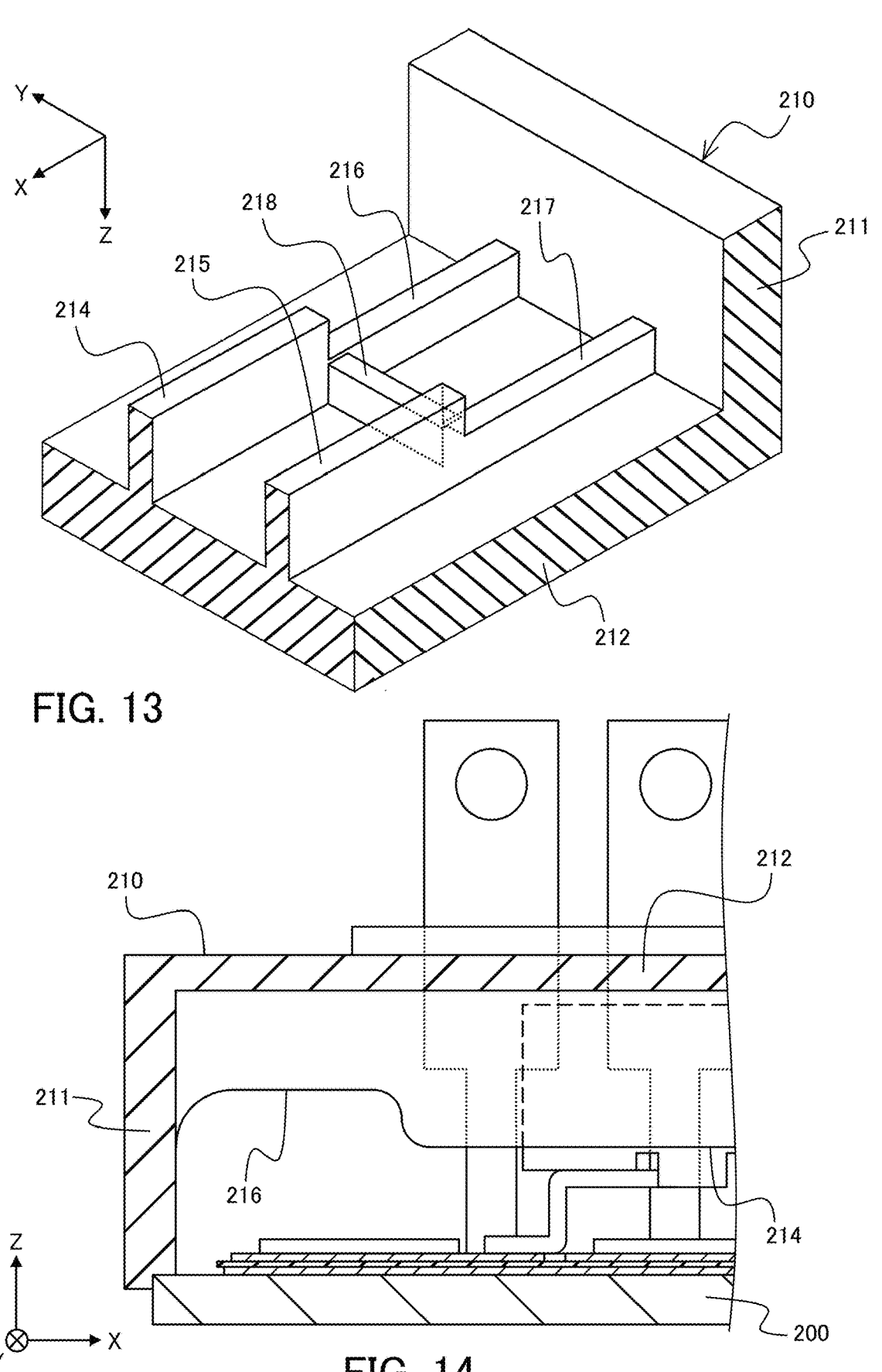
FIG. 13 is a perspective view for describing a first modification of the cutout section provided in the partition portion.
FIG. 14 is a side cross-sectional view for describing a second modification of the cutout section provided in the partition portion.
Figure 15:
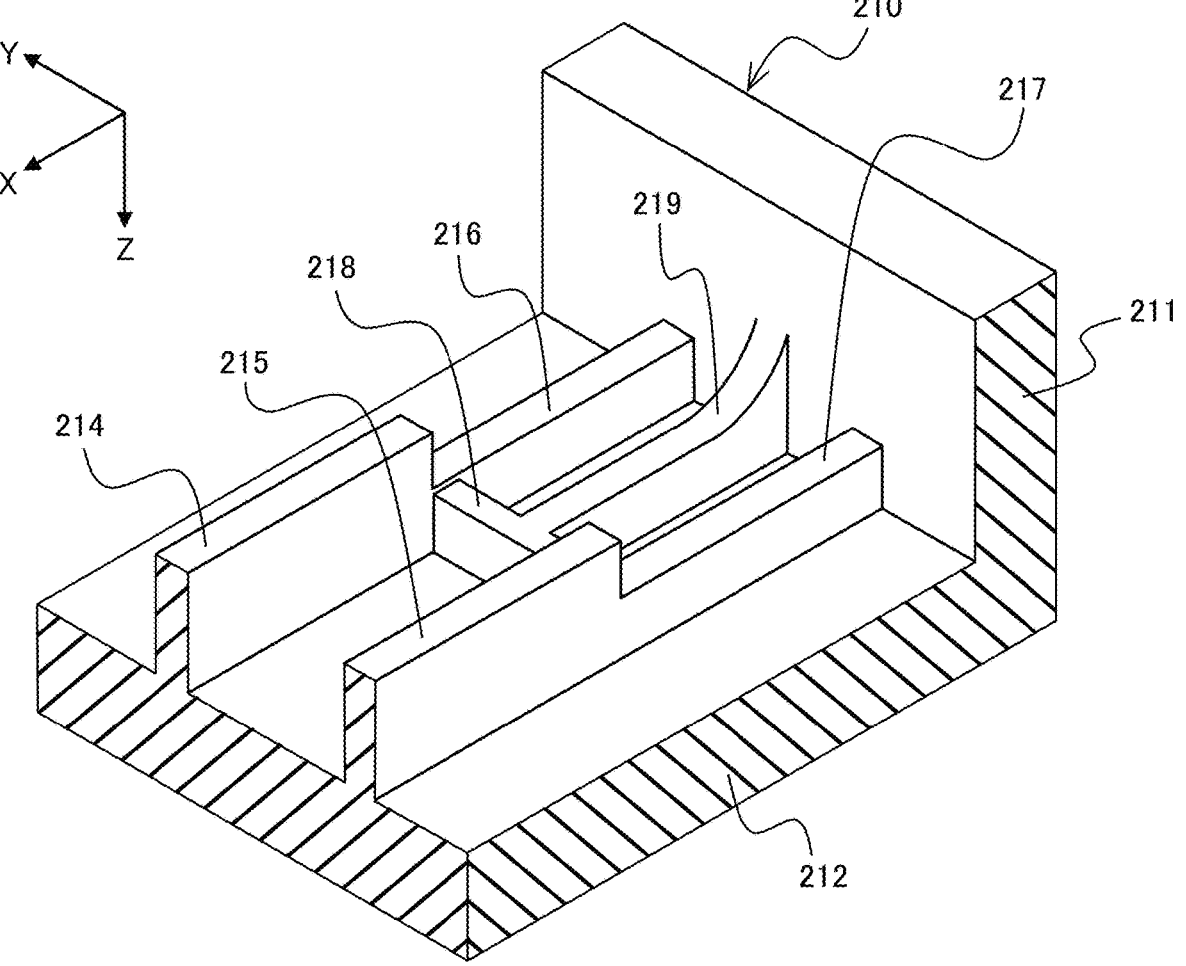
FIG. 15 is a perspective view for describing a third modification of the cutout section provided in the partition portion.
Figure 16:
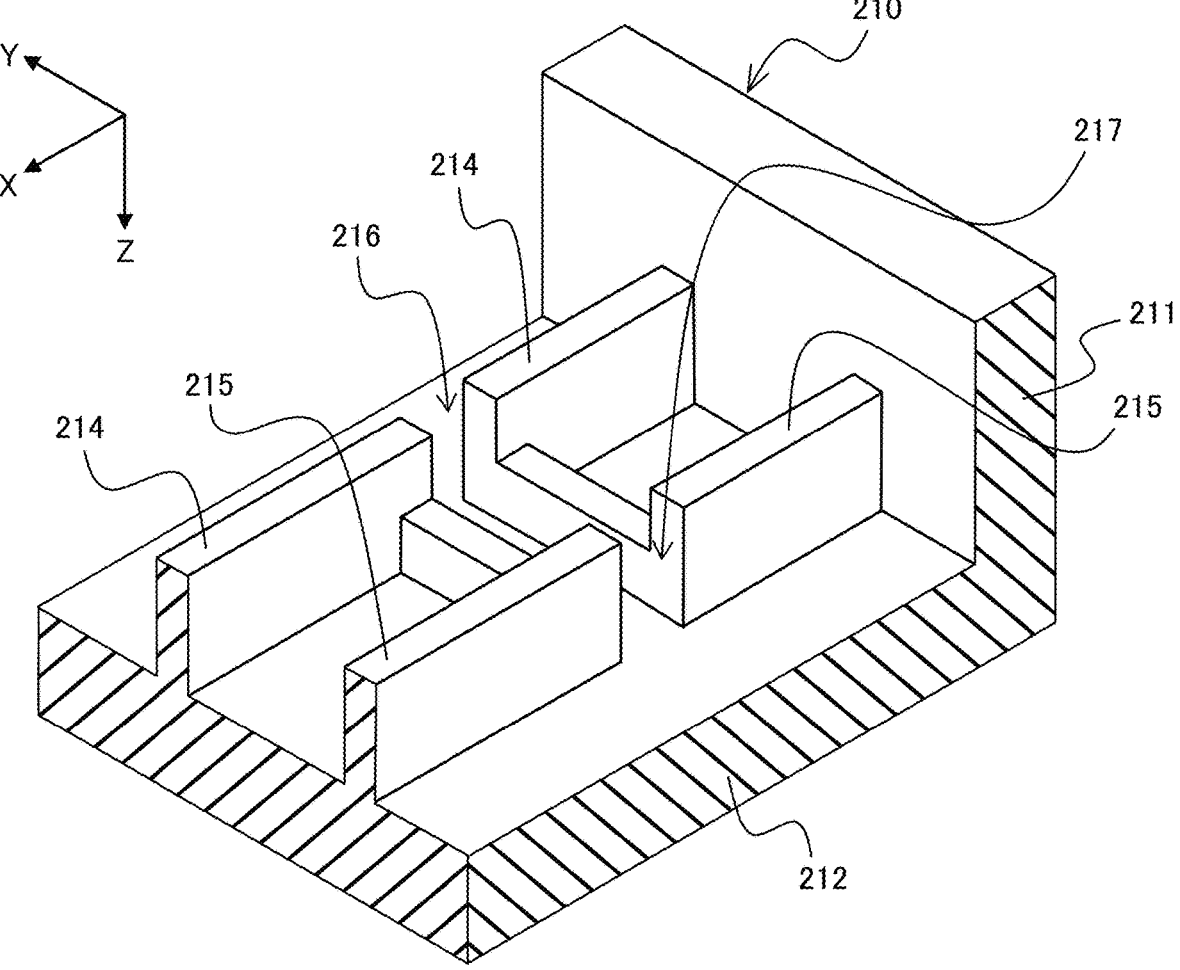
FIG. 16 is a perspective view for describing a fourth modification of the cutout section provided in the partition portion.

FIG. 13 is a perspective view for describing a first modification of the cutout section provided in the partition portion. FIG. 14 is a side cross-sectional view for describing a second modification of the cutout section provided in the partition portion. FIG. 15 is a perspective view for describing a third modification of the cutout section provided in the partition portion. FIG. 16 is a perspective view for describing a fourth modification of the cutout section provided in the partition portion.

In the case 210 exemplified in FIG. 13, the cutout section 216 of the first partition portion 214 and the cutout section 217 of the second partition portion 215 each extend to the inner surface of the side surface portion 211. Accordingly, the through hole formed by the cutout sections 216 and 217 becomes large, and when the second sealing material 702 is injected, the second sealing material 702 easily flows into each of the second space and the third space from the first space, and the time required for the step of injecting the second sealing material 702 can be shortened.

In addition, in the case 210 illustrated in FIG. 13, a beam portion 218 connected to the cutout section 216 of the first partition portion 214 and the cutout section 217 of the second partition portion 215 is provided. By providing the beam portion 218, for example, it is possible to suppress the influence of the lowered height of each of the partition portions 214 and 215 from the lid portion 212 in the cutout sections 216 and 217 on the strength of the case 210 and deformation such as warping and twisting.

In the case 210 illustrated in FIG. 14, the lower end surface of the cutout section 216 is changed to a curved surface so that the height from the lid portion 212 at the end portion in the X direction of the cutout section 216 continuously changes. The case 210 is formed, for example, by injection molding. When forming the case 210 by injection molding, for example, by forming the lower end surface of the cutout section 216 into a curved surface as illustrated in FIG. 14, the fluidity of the insulating material in a cavity of a mold can be further improved as compared with an example where the height changes stepwise (discontinuously) as illustrated in FIG. 13 and the like, and thus shape defects of the cutout sections 216 and 217 and the like can be further reduced.

In the case 210 exemplified in FIG. 15, the cutout section 216 of the first partition portion 214 and the cutout section 217 of the second partition portion 215 each extend to the inner surface of the side surface portion 211. In addition, between the cutout section 216 of the first partition portion 214 and the cutout section 217 of the second partition portion 215, a first beam portion 218 connecting the cutout sections and a second beam portion 219 connecting the first beam portion 218 and the side surface portion 211 of the case 210 are provided. The second beam portion 219 has a curved surface end portion connected to the side surface portion 211, thereby increasing a connection area between the second beam portion 219 and the side surface portion 211 in the Z direction. By providing such a second beam portion 219, it is possible to suppress deformation such as warping and twisting of the side surface portion 211 to which the first partition portion 214 and the second partition portion 215 are connected.

In the case 210 illustrated in FIG. 16, the height of each of the cutout section 216 of the first partition portion 214 and the cutout section 217 of the second partition portion 215 from the lid portion 212 to the lower end is 0. The cutout sections 216 and 217 may be at any positions, as long as the positions do not affect insulation performances between the conductor plates 6A, 6B, and 6C by the partition portions 214 and 215 extending in the X direction, and may be, for example, sections divided (separated) at positions not overlapping the conductor plates.

Note that the configurations of the cutout sections 216 and 217 in the partition portions 214 and 215 of the case 210 described above with reference to FIGS. 1 to 16 are merely examples of the cutout sections 216 and 217 in the semiconductor module 2 according to the present embodiment. The cutout sections 216 and 217 in the semiconductor module 2 according to the present embodiment may have a plurality of features separately illustrated in a plurality of drawings. In addition, positions, shapes, and the like of the cutout sections 216 and 217 in the semiconductor module 2 according to the present embodiment are not limited to those described above and can be appropriately changed. For example, depending on the positional relationship between the base portion 601 of the first conductor plate 6A, the base portion 601 of the second conductor plate 6B, and the base portion 601 of the third conductor plate 6C, the position where the cutout section 216 of the first partition portion 214 is provided and the position where the cutout section 217 of the second partition portion 215 is provided may be end portions on opposite sides to each other in the X direction. Furthermore, a plurality of the cutout sections may be provided for each partition portion.

The appearance and the shape of the accommodation space of the case 210 are not limited to a specific shape. For example, the accommodation space of the case 210 may be divided into four or more spaces by three or more partition portions and the first sealing material. In addition, the accommodation space of the case 210 may be divided into, for example, two spaces by one partition portion and the first sealing material.

In addition, the semiconductor module 2 described above may be incorporated as a semiconductor device into an electronic device such as a power conversion device. The terms "semiconductor module" and "semiconductor device" are merely convenient expressions for identifying what each refers to and can be rephrased. For example, the semiconductor module 2 in the present specification may be rephrased as the semiconductor device 2, and the semiconductor device 1 in the present specification may be rephrased as the semiconductor module 1 or another term.

The semiconductor device 1 including the semiconductor module 2 according to the embodiment described above is not limited to a specific application but is suitable for use particularly in a high-temperature and high-humidity environment. For example, the semiconductor module 2 according to the embodiment described above may be applied to a power conversion device such as an inverter device of an in-vehicle motor or the like. A vehicle to which the semiconductor device 1 according to the present invention is applied is described with reference to FIG. 17.

Figure 17:
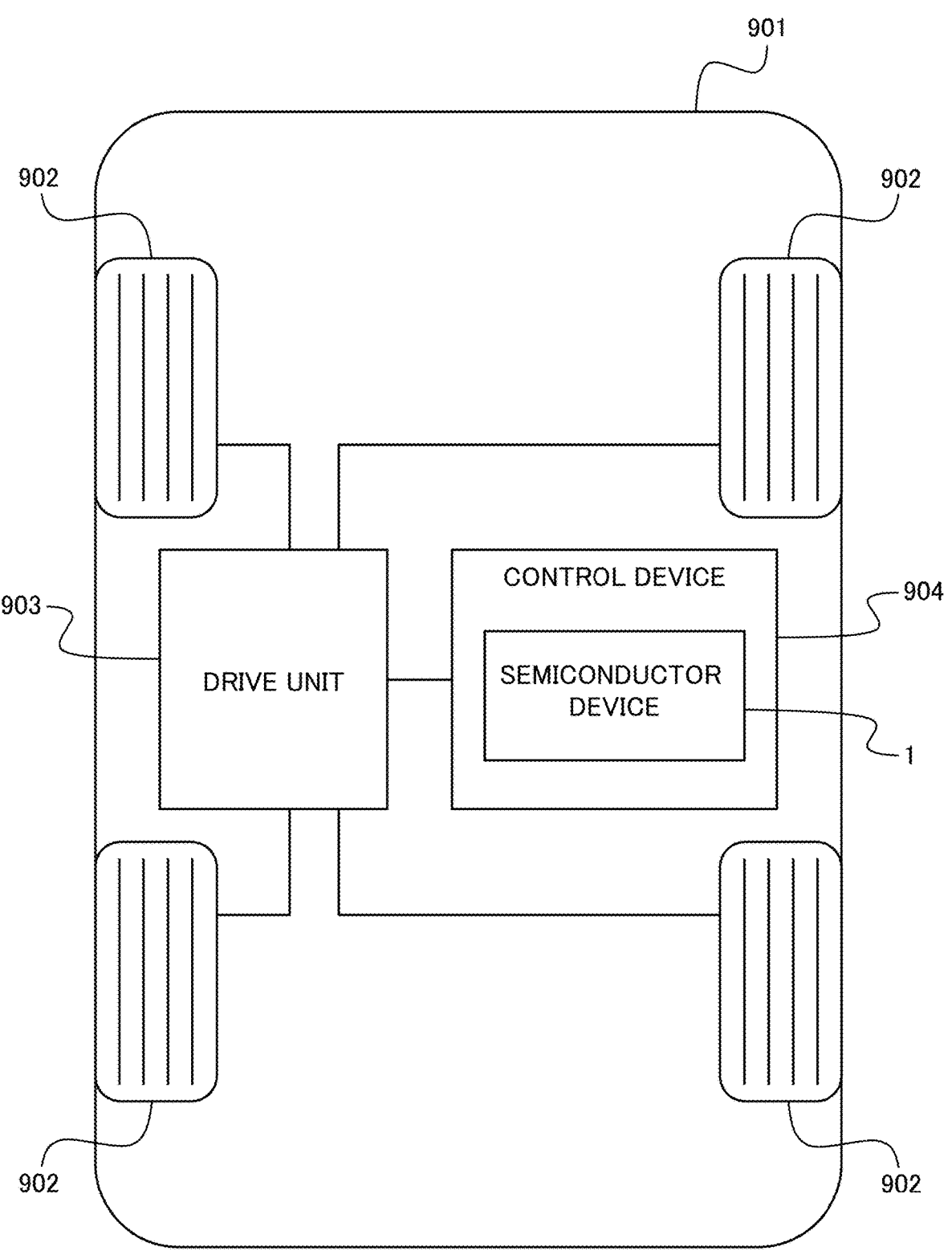
FIG. 17 is a schematic plan view illustrating an example of a vehicle to which the semiconductor device according to the present invention is applied.

FIG. 17 is a schematic plan view illustrating an example of a vehicle to which the semiconductor device according to the present invention is applied. A vehicle 901 illustrated in FIG. 17 is configured with, for example, a four-wheeled vehicle including four wheels 902. The vehicle 901 may be, for example, an electric vehicle that drives wheels by a motor or the like, or a hybrid vehicle using power of an internal combustion engine in addition to the motor.

The vehicle 901 includes a drive unit 903 that imparts power to the wheels 902 and a control device 904 that controls the drive unit 903. The drive unit 903 may be configured with, for example, at least one of an engine, a motor, and a hybrid of the engine and the motor.

The control device 904 performs control (for example, power control) of the drive unit 903. The control device 904 includes the semiconductor device 1 including the semiconductor module 2 according to the embodiment described above. The semiconductor device 1 can be configured to perform power control on the drive unit 903. The semiconductor device 1 may have a configuration in which a heat dissipation member such as a heat sink that dissipates heat generated in the semiconductor module 2, the cooler 3 that cools the semiconductor module 2 or the heat dissipation member, and the like are attached to the semiconductor module 2. The semiconductor device 1 may include a plurality of semiconductor modules 2. Further, the semiconductor device 1 may refer to the semiconductor module 2 itself.

The semiconductor device 1 (semiconductor module 2) of the control device 904 installed in the vehicle 901 may operate during traveling of the vehicle 901 or the like and may operate in an environment of high temperature (for example, around 100° C.) and high humidity (for example, humidity 90%). Therefore, by applying the semiconductor device 1 including the semiconductor module 2 according to the embodiment described above, for example, it is possible to suppress corrosion of the circuit components and the like of the circuit board 4 due to corrosive gas, moisture, dust, and the like that enter the accommodation space of the case 210 and a decrease in insulation properties, and it is possible to reduce the frequency of inspection of the control device 904, the frequency of replacement of the semiconductor module 2, and the like.

The embodiment of the semiconductor module 2 according to the present invention is not limited to the embodiment described above, and various changes, substitutions, and modifications may be made without departing from the spirit of the technical concept. Further, when the technical concept can be realized in another manner by the progress of the technology or another derived technology, the technical idea may be performed by using a method thereof. Therefore, the claims cover all embodiments that may be included within the scope of the technical concept.

In the following, feature points in the embodiment described above are summarized.

A semiconductor module according to the embodiment described above includes: a base on which a circuit board is mounted; a case that covers the circuit board mounted on the base, the case having a side surface portion surrounding an outer periphery of the circuit board and a lid portion positioned above the circuit board; a plurality of conductor plates each of which is electrically connected to a conductor pattern of the circuit board and extends to an outside of the case through a slit provided in the case; and a sealing material that seals the circuit board, in which the case has a partition portion that is disposed in a region surrounded by the lid portion, the side surface portion, and the circuit board, is disposed between the plurality of conductor plates, and insulates the plurality of conductor plates, and the partition portion has a cutout section at a position not overlapping the plurality of conductor plates when viewed from a direction perpendicular to a plane on which the plurality of conductor plates and the partition portion extend in parallel to each other, and thus a height of a second portion not overlapping the plurality of conductor plates is lower than a height of a first portion overlapping the plurality of conductor plates.

In the semiconductor module according to the embodiment described above, a distal end portion of the partition portion in a height direction in a portion overlapping the two conductor plates is in contact with the sealing material.

In the semiconductor module according to the embodiment described above, the sealing material includes a first sealing material that seals the circuit board and a second sealing material on the first sealing material, and an upper surface of the first sealing material is between a distal end position of the partition portion in a height direction in a portion overlapping the two conductor plates and a distal end position of the cutout section in the height direction.

In the semiconductor module according to the embodiment described above, the partition portion of the case includes a first partition portion and a second partition portion extending in parallel to each other and further includes a beam portion connected to a cutout section of the first partition portion and a cutout section of the second partition portion.

In the semiconductor module according to the embodiment described above, the partition portion of the case includes a first partition portion and a second partition portion extending in parallel to each other and further includes a first beam portion connected to a cutout section of the first partition portion and a cutout section of the second partition portion and a second beam portion connected to the first beam portion and the side surface portion.

In the semiconductor module according to the embodiment described above, a height of the partition portion from the lid portion in the cutout section changes with a curved surface.

A semiconductor device according to the embodiment described above includes the semiconductor module described above; and a cooler disposed on a surface opposite to a surface of the base of the semiconductor module on which the circuit board is mounted.

The vehicle according to the embodiment described above includes the semiconductor module or the semiconductor device described above.

INDUSTRIAL APPLICABILITY

As described above, the present invention has an effect of being able to suppress corrosion of a circuit component of a circuit board that is accommodated in a case in which a lid portion is integrated and that is sealed by a sealing material injected from an injection hole provided in the lid portion and is particularly useful for a semiconductor module, a semiconductor device, and a vehicle for industry or electrical equipment.

The present application is based on Japanese Patent Application No. 2022-148608 filed on Sep. 16, 2022. All the contents are included herein.

The invention claimed is:
1. A semiconductor module, comprising:
a circuit board having a plurality of conductive patterns;
a base on which the circuit board is mounted;

a case that covers the circuit board mounted on the base, the case having a sidewall surrounding an outer periphery of the circuit board and a lid positioned above the circuit board;

a plurality of conductive plates each of which is electrically connected to a respective one of the plurality of conductive patterns of the circuit board and extends to an outside of the case through a corresponding slit provided in the case, the plurality of conductive plates each being parallel to a predetermined plane; and a sealing material that seals the circuit board, wherein the lid of the case has a partition that protrudes in a direction parallel to the predetermined plane from an inner surface of the lid toward the base, and is disposed in an area of the inner surface of the lid above the circuit board, between two of the plurality of conductive plates to insulate the two of the plurality of conductive plates from each other, and the partition has a first portion and a second portion, in a side view of the semiconductor module that is viewed in a direction perpendicular to the predetermined plane, the first portion being located at a position at which the partition and the plurality of conductive plates overlap each other, the second portion the being located at a position at which the partition and the plurality of conductive plates do not overlap each other, and the second portion of the partition has a cutout section that is disposed such that in a depth direction perpendicular to a surface of the base, a distance from the surface of the base to an end of the second portion is greater than a distance from the surface of the base to an end of the first portion.

2. The semiconductor module according to claim 1, wherein the end of the first portion of the partition is in contact with the sealing material.

3. The semiconductor module according to claim 1, wherein
the sealing material includes a first sealing material that seals the circuit board and a second sealing material covering an upper surface of the first sealing material, and
the upper surface of the first sealing material is located between a position of the end of the first portion and a position of the end of the second portion of the partition in the depth direction.

4. The semiconductor module according to claim 1, wherein
the partition of the case includes a first partition and a second partition each extending in parallel to the predetermined plane, the first partition having the first portion, and the second partition having the second portion with the cutout section, and
the partition further includes a beam portion connecting the cutout section of the first partition to the cutout section of the second partition.

5. The semiconductor module according to claim 1, wherein
the partition of the case is an overall partition that includes a first partition and a second partition each extending in parallel to the predetermined plane, the first partition having the first portion, the second partition having the second portion with the cutout section, and
the overall partition further includes a first beam portion connecting the cutout section of the first partition to the cutout section of the second partition, and a second beam portion connecting the first beam portion to the sidewall.

6. The semiconductor module according to claim 1, wherein a distance in the depth direction of the cutout section of the second portion of the partition from the inner surface of the lid gradually increases such that the end of the second portion is curved.

7. A semiconductor device, comprising:

the semiconductor module according to claim 1; and a cooler disposed on a surface opposite to the surface of the base of the semiconductor module on which the circuit board is mounted.

8. A vehicle comprising the semiconductor module according to claim 1.

\* \* \* \* \*